(12) United States Patent
Sutardja et al.

(10) Patent No.: US 7,288,845 B2
(45) Date of Patent: Oct. 30, 2007

(54) FABRICATION OF WIRE BOND PADS OVER UNDERLYING ACTIVE DEVICES, PASSIVE DEVICES AND/OR DIELECTRIC LAYERS IN INTEGRATED CIRCUITS

(75) Inventors: Sehat Sutardja, Los Altos Hills, CA (US); Albert Wu, Palo Alto, CA (US); Jin-Yuan Lee, Hsin-chu (TW); Mou-Shiung Lin, Hsin-chu (TW)

(73) Assignees: Marvell Semiconductor, Inc., Sunnyvale, CA (US); MEGIC Corporation, Hsinchu (TW)

( * ) Notice: Subject to any disclaimer, the term of this patent is extended or adjusted under 35 U.S.C. 154(b) by 0 days.

(21) Appl. No.: 10/434,524

(22) Filed: May 8, 2003

(65) Prior Publication Data
US 2004/0070086 A1    Apr. 15, 2004

Related U.S. Application Data

(60) Provisional application No. 60/418,551, filed on Oct. 15, 2002.

(51) Int. Cl.
*H01L 23/485* (2006.01)
(52) U.S. Cl. ............ 257/781; 257/786; 257/784; 257/E23.02
(58) Field of Classification Search ............ 257/784, 257/781, 786, E23.02
See application file for complete search history.

(56) References Cited

U.S. PATENT DOCUMENTS 4,927,505 A * 5/1990 Sharma et al. ............ 205/123
5,108,950 A * 4/1992 Wakabayashi et al. ...... 438/614
5,384,488 A    1/1995 Golshan et al.
5,659,201 A    8/1997 Wollesen (Continued)

FOREIGN PATENT DOCUMENTS
JP      58028858      2/1983

(Continued)

OTHER PUBLICATIONS

Lammers, David "LSI Logic Extends Reach of Wire Bond Packaging," *EE Times* Oct. 23, 2001 at <http://www.eet.com/story/OEG20021022S0023> visited on Oct. 23, 2002, 4 pages total.

(Continued)

*Primary Examiner*—Evan Pert
*Assistant Examiner*—Victor A. Mandala, Jr.
(74) *Attorney, Agent, or Firm*—Klaus P. Stoffel; Wolff & Samson PC

(57) ABSTRACT

A wire connection structure for an integrated circuit (IC) die includes a semiconductor wafer with an active device and/or a passive device. One or more dielectric layers are arranged adjacent to the active and/or passive device. One or more metal interconnect layers are arranged adjacent to the active and/or passive device. A contact pad is arranged in an outermost metal interconnect layer. A passivation layer is arranged over the outermost metal interconnect layer and includes at least one passivation opening that exposes the contact pad. A bond pad is arranged over the passivation layer and the active/or passive device and is connected to the contact pad through the passivation opening. Formation of the bond pad does not damage the active and/or passive device.

28 Claims, 6 Drawing Sheets

U.S. PATENT DOCUMENTS

| | | | |
|---|---|---|---|
| 5,665,639 A | 9/1997 | Seppala et al. | |
| 5,719,448 A | 2/1998 | Ichikawa | |
| 5,969,424 A | 10/1999 | Matsuki et al. | |
| 6,037,668 A | 3/2000 | Cave et al. | |
| 6,066,877 A * | 5/2000 | Williams et al. | 257/341 |
| 6,143,396 A | 11/2000 | Saran et al. | |
| 6,184,121 B1 | 2/2001 | Buchwalter et al. | |
| 6,187,680 B1 | 2/2001 | Costrini et al. | |
| 6,204,074 B1 | 3/2001 | Bertolet et al. | |
| 6,229,221 B1 | 5/2001 | Kloen et al. | |
| 6,232,662 B1 | 5/2001 | Saran | |
| 6,303,423 B1 | 10/2001 | Lin | |
| 6,376,353 B1 | 4/2002 | Zhou et al. | |
| 6,378,759 B1 * | 4/2002 | Ho et al. | 228/180.21 |
| 6,383,916 B1 | 5/2002 | Lin | |
| 6,465,879 B1 * | 10/2002 | Taguchi | 257/673 |
| 6,544,880 B1 | 4/2003 | Akram | |
| 6,593,649 B1 | 7/2003 | Lin et al. | |
| 6,649,509 B1 | 11/2003 | Lin et al. | |
| 6,706,622 B1 | 3/2004 | McCormick | |
| 6,710,460 B2 | 3/2004 | Morozumi | |
| 6,730,982 B2 | 5/2004 | Barth et al. | |
| 6,756,295 B2 | 6/2004 | Lin et al. | |
| 6,762,115 B2 | 7/2004 | Lin et al. | |
| 6,800,555 B2 | 10/2004 | Test et al. | |
| 2002/0068385 A1 | 6/2002 | Ma et al. | |
| 2003/0087130 A1* | 5/2003 | Sugawara | 428/692 |
| 2004/0070042 A1* | 4/2004 | Lee et al. | 257/459 |
| 2004/0166659 A1 | 8/2004 | Lin et al. | |

FOREIGN PATENT DOCUMENTS

| | | |
|---|---|---|
| WO | WO 00/35013 | 6/2000 |

OTHER PUBLICATIONS

MEG02-008 "Method of Wire Bonding Over Active Area of a Semiconductor Circuit"—U.S. Appl. No. 09/858,528, filed on May 7, 2001.

* cited by examiner

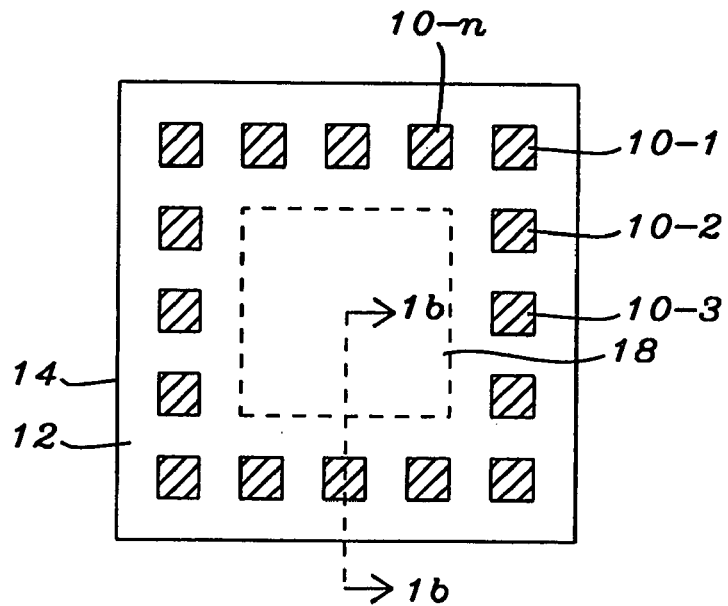
FIG. 1a – Prior Art
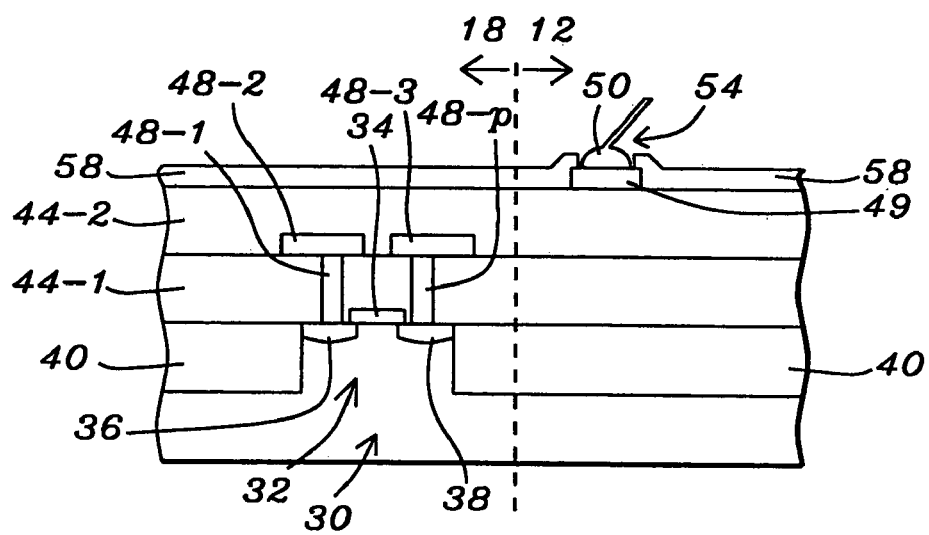
FIG. 1b – Prior Art

FABRICATION OF WIRE BOND PADS OVER UNDERLYING ACTIVE DEVICES, PASSIVE DEVICES AND/OR DIELECTRIC LAYERS IN INTEGRATED CIRCUITS

CROSS-REFERENCE TO RELATED APPLICATIONS

This application claims the benefit of U.S. Provisional Application No. 60/418,551 filed on Oct. 15, 2002, which is hereby incorporated by reference in its entirety.

RELATED APPLICATIONS

This application is related to U.S. patent application Ser. No. 09/858,528, filed on May 7, 2001, now issued as U.S. Pat. No. 6,593,649, and U.S. patent application Ser. No. 10/434,142, filed on May 8, 2003, both of which are assigned to one of the joint Assignees of the present invention and which are hereby incorporated by reference in their entirety.

FIELD OF THE INVENTION

The present invention relates to the fabrication of integrated circuit (IC) devices, and more particularly to the fabrication of wire bond pads over underlying active devices, passive devices and/or weak dielectric layers in IC devices.

BACKGROUND OF THE INVENTION

Integrated circuits (ICs) are semiconductor devices that contain active devices such as transistors and diodes and/or passive devices such as capacitors, resistors and inductors. Performance characteristics of the ICs are typically improved by reducing the dimensions of the active and/or passive devices in the IC. The reduced dimensions of the IC devices allow an increased number of devices to be fabricated in the same chip area to provide additional functionality and/or the same number of devices can be fabricated in a reduced chip area. The reduced dimensions also typically reduce $I^2R$ losses and increase switching speeds. One restraint on further size reductions relates to layout requirements of data input/output or power/ground connections that are made to the IC.

Typically, the IC is mounted on a package. Solder bumps and bond wires on the package are connected to bond pads on the IC. Pins provide external connections to the package. The bond pads are typically made of aluminum (Al) and/or aluminum alloy (Al-alloy). The bond pads are deposited onto the IC using conventional sputtering and photolithography techniques. The conventional process for forming bond pads is both expensive and complex.

The bond pads formed on the IC are typically located in a first region of the IC. The bond pads provide connections to metal interconnects and vias, which in turn provide connections to active and/or passive devices of the IC. The bond pads are usually not formed over a second region that contains the active and/or passive devices. For example, the first region may include an outer perimeter of the IC that surrounds the second or inner region of the IC.

One reason for the mutually exclusive first and second regions is related to thermal and/or mechanical stress that occurs during wire bonding. An outermost metal interconnection layer is typically covered by a passivation layer. Openings in the passivation layer expose contact pads, which are patterned in the outermost metal interconnect layer. Wires are bonded to the contact pads. If active regions are located below the contact pads, the processing will damage the underlying dielectric, the active devices and/or the passive devices. The dielectric is particularly susceptible if it is formed using a weak or low-k dielectric metal.

Referring now to FIG. 1a, conventional bond pads 10-1, 10-2, . . . , 10-n (collectively identified by 10) are typically arranged in a first region 12 of an integrated circuit (IC) die 14. The first region 12 may correspond to an outer region or perimeter of the IC 14, although other arrangements may be used. The bond pads 10 are laterally displaced from a second region 18, which is separate from the first region 12. The second region 18 contains underlying dielectric layers, active devices, and/or passive devices of the IC die 14. The second region 18 may be a central region that is surrounded by the outer region. Positioning the dielectric layer(s), the active device(s) and/or the passive device(s) in laterally separate regions avoids damage that may be caused by thermal and/or mechanical stress that occurs during wire bonding.

Referring now to FIG. 1b, an exemplary active device 30 is located in the second region 18 and includes a transistor 32 with a gate 34, a source 36, a drain 38, and field isolation regions 40. While the transistor 32 is shown for illustration purposes, other types of active and/or passive devices may be located in the second region 18. One or more dielectric layers 44-1 and 44-2 and one or more metal interconnect layers 48-1, 48-2, . . . , and 48-p (collectively identified as 48) and vias (not shown) are used to provide connections between the active and/or passive devices and contact pads 49, which are formed in the outermost metal interconnect layer 48. Vias are typically used to provide connections between the metal interconnect layers.

A passivation layer 58 is typically formed on top of the outermost metal interconnect layer. Openings 54 in the passivation layer expose the contact pads 49. Wire 50 is bonded to the contact pad through passivation opening 54. While only one active device and one bond pad is shown, additional active devices, passive devices and/or bond pads can be provided. The passivation layer is typically deposited using chemical vapor deposition (CVD), although other processes may be used. The metal interconnect layers and vias are typically made of Al or Al-alloy, although other materials may be used.

The conventional layout depicted in FIGS. 1a and 1b requires lateral separation between the first region 12 containing the bond pad(s) and the second region 18 containing the underlying dielectric layer(s), active device(s) and/or passive device(s). This requirement significantly increases the size of the IC die 14 because the second region 18 is not available for bond pads.

SUMMARY OF THE INVENTION

A wire connection structure for an integrated circuit (IC) die includes a semiconductor wafer with at least one active device and/or passive device. One or more dielectric layers are arranged adjacent to, or over the active and/or passive devices. One or more metal interconnect layers are arranged adjacent to, or over the active and/or passive devices. A contact pad is arranged in an outermost metal interconnect layer. A passivation layer is arranged over the outermost metal interconnect layer and includes at least one passivation opening that exposes the contact pad. A bond pad is arranged over the passivation layer and the active and/or passive device and is connected to the contact pad through the passivation opening. Formation of the bond pad does not damage the active and/or passive device.

In other features, a wire is bonded to the bond pad in a wire bonding region. The wire bonding region is formed over the passivation opening or is laterally displaced from the passivation opening. The dielectric layers include a low-k dielectric material. The passivation layer includes one or more layers of inorganic material.

In still other features, the bond pad includes an adhesion layer arranged adjacent to, or over, the passivation layer and the exposed contact pad. A first layer is arranged adjacent to, or over the adhesion layer. A second layer is arranged adjacent to the first layer.

In still other features, the adhesion layer includes at least one of titanium (Ti), chromium (Cr), titanium tungsten (TiW) and titanium nitride (TiN). The first layer includes gold that is deposited by sputtering. The second layer includes gold that is deposited by electroplating. The second layer has a hardness range of less than about 150 Hv. The gold of the second layer has a purity that is greater than or equal to about 97% and a thickness that is greater than or equal to 1 μm.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIGS. 1a and 1b illustrate plan and cross-sectional views of conventional bond pads in an IC die;

DETAILED DESCRIPTION OF THE PREFERRED EMBODIMENTS

Figure 2:
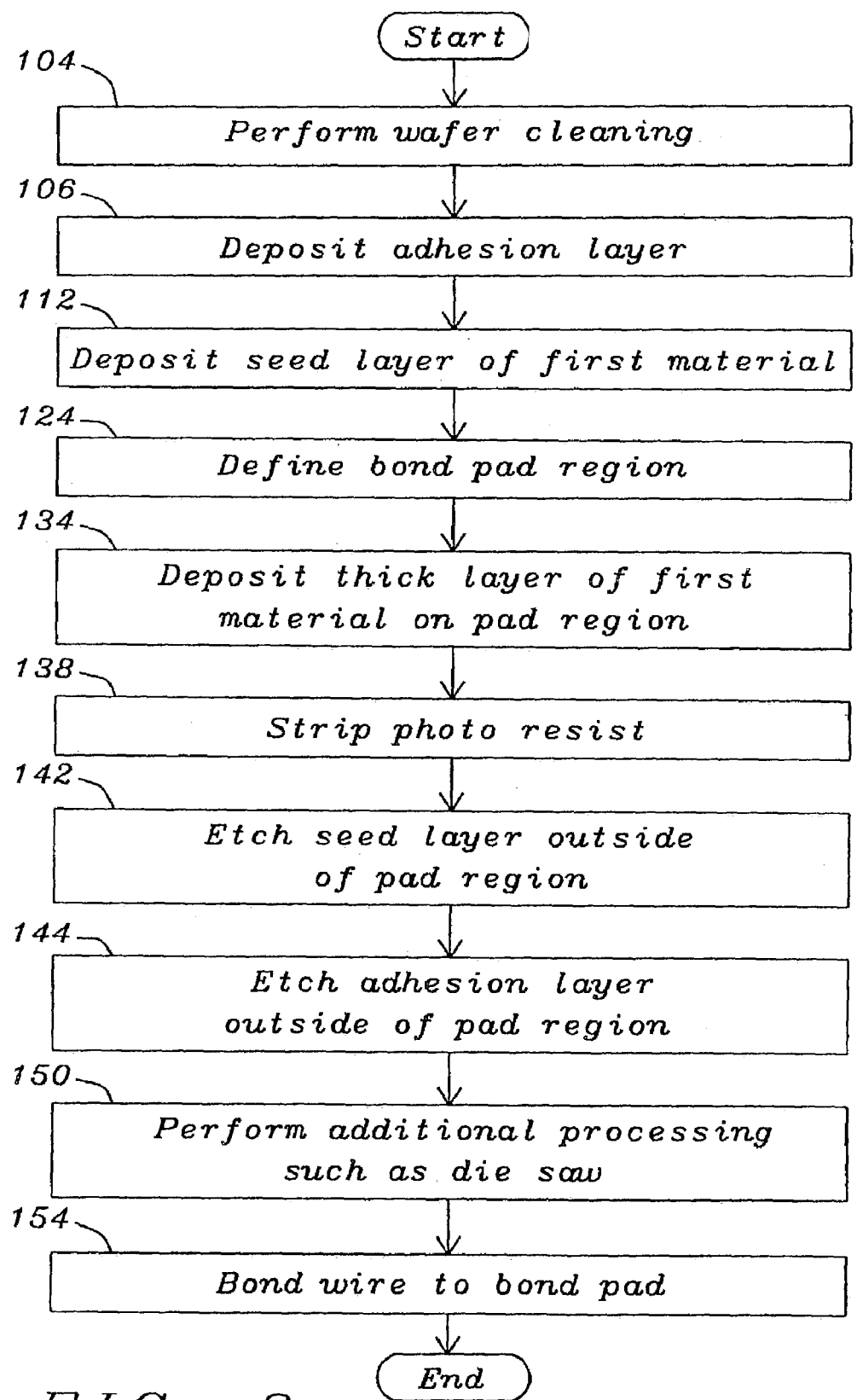
FIG. 2 illustrates steps of method for fabricating bond pads on an IC die according to the present invention.

The following description of the preferred embodiment(s) is merely exemplary in nature and is in no way intended to limit the invention, its application, or uses. For purposes of clarity, the same reference numbers will be used in the drawings to identify the same elements.

Conventional methods for wire bonding that were described above damage underlying dielectric layers, active devices and/or passive devices. To avoid damage to these structures during wire bonding, these structures are usually located in areas that are not under the bond pads. This layout requirement significantly increases the IC die size, which increases the cost of the IC. As will be described below, the present invention allows wire bonding, and the pads to which bond wires are attached, over the dielectric layers and/or the active and/or passive devices without damaging the dielectric layers or the devices. As a result, the IC die size can be reduced, which lowers the cost of the IC.

Figure 3:
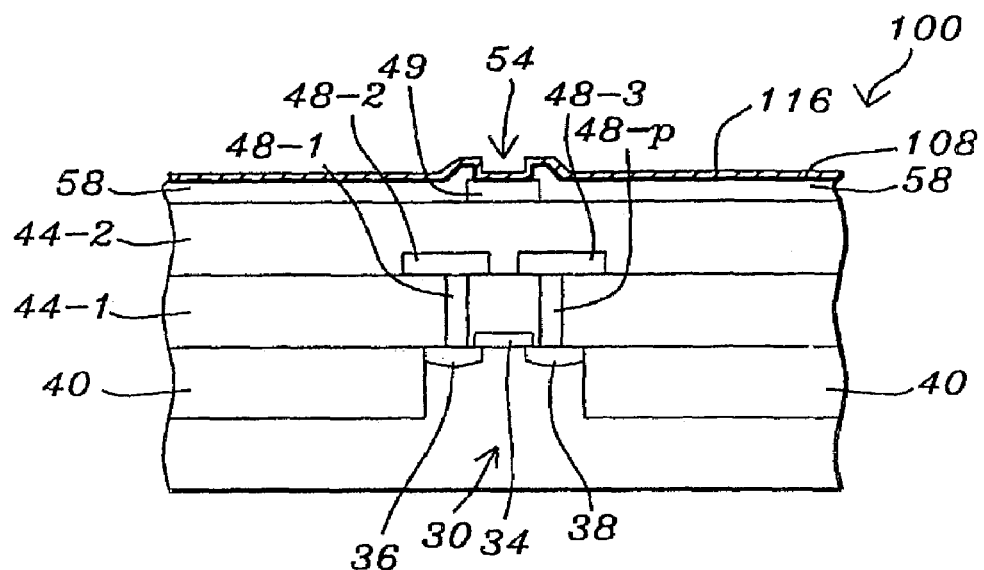
FIGS. 3-5 illustrate processing of the IC die according to the steps shown in FIG. 2.

Referring now to FIGS. 2 and 3, steps for fabricating an improved IC die according to the present invention are shown. Initially, a wafer cleaning process is performed on an IC die 100 in step 104. In step 106, an adhesion layer 108 is deposited onto the passivation layer 58. The adhesion layer 108 is also deposited in the passivation opening 54 and/or into the array of passivation openings and onto the contact pad(s) 49. The passivation opening 54 preferably has a width of approximately 0.5 μm or greater, although widths that are greater than 0.1 μm are also acceptable. The passivation layer 58 is preferably formed using one or more layers of inorganic materials. For example, the passivation layer 58 may include a first layer of a first material and a second layer of a second material. In a preferred embodiment, the first material is silicon oxide having an approximate thickness of 0.5 μm and the second layer is silicon nitride having an approximate thickness of 0.7 μm.

In preferred embodiments, the adhesion layer 108 includes at least one of titanium tungsten (TiW), titanium nitride (TiN), titanium (Ti), and chromium (Cr), although other suitable materials can be used. In a preferred embodiment, the adhesion layer 108 has a thickness of approximately 3000 Angstroms and is deposited by sputtering, although other processes and thicknesses can be used.

In step 112, a first or seed layer 116 is deposited onto the adhesion layer 108. The first layer 116 is also deposited onto the adhesion layer 108 in the passivation opening 54 and/or the array of passivation openings. The first layer 116 is formed of a seed layer for the subsequent thick metal electroplating. In a preferred embodiment, the first layer 116 includes gold (Au). In a preferred embodiment, the first layer 116 is deposited by sputtering to a thickness of approximately 1000 Angstroms, although other suitable processes and thicknesses can be used.

Figure 4:
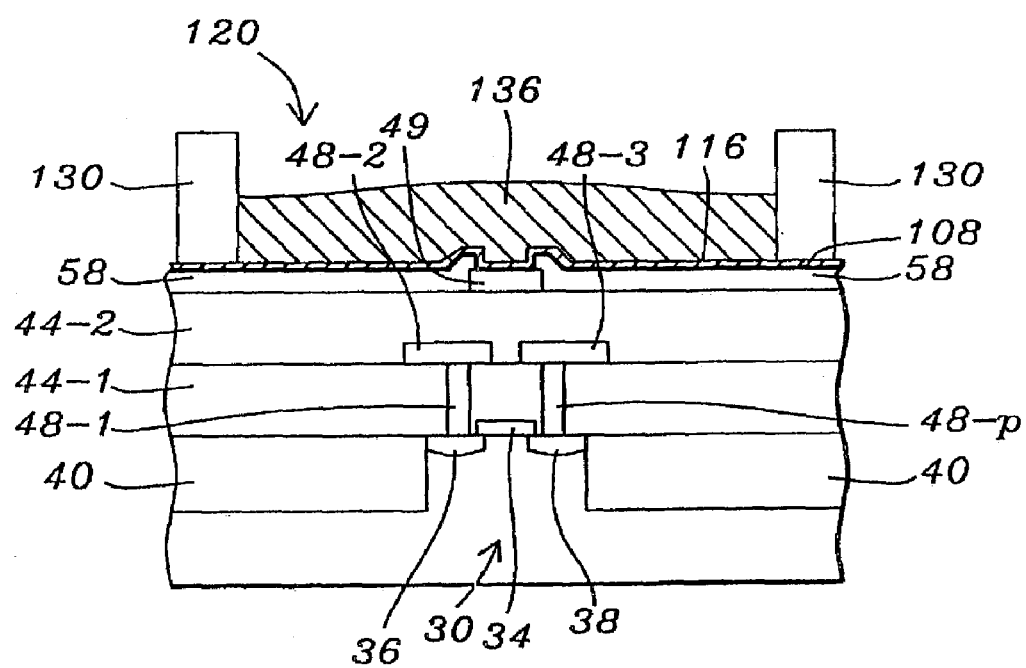

Referring now to FIGS. 2 and 4, a bond pad region 120 is defined in step 124. In a preferred embodiment, the bond pad region 120 is defined using conventional photolithography. The bond pad region 120 is defined by photoresist 130. In a preferred embodiment, the photoresist 130 is a liquid coating having a thickness of 20-22 μm, although other processes and thicknesses can be used. For example, a dry film photoresist can also be used.

In step 134, a second or bulk layer 136 is formed in the bond pad region 120 that is defined by the photoresist 130. The second layer 136 is preferably formed of a compliant material. The second layer 136 is also formed in the passivation opening 54 and/or array of passivation openings. In a preferred embodiment, the second layer 136 is electroplated to a thickness that is greater than about 1 μm to provide adequate stress absorption, although other processes and thicknesses can be used. The second layer 136 preferably includes gold (Au) having a purity that is greater than or equal to about 97%. The second layer 136 preferably has a hardness range that is less than or equal to approximately 150 Hv (Vickers Hardness). The second layer 136 includes a relatively soft material to increase stress absorption properties of the second layer.

Figure 5:
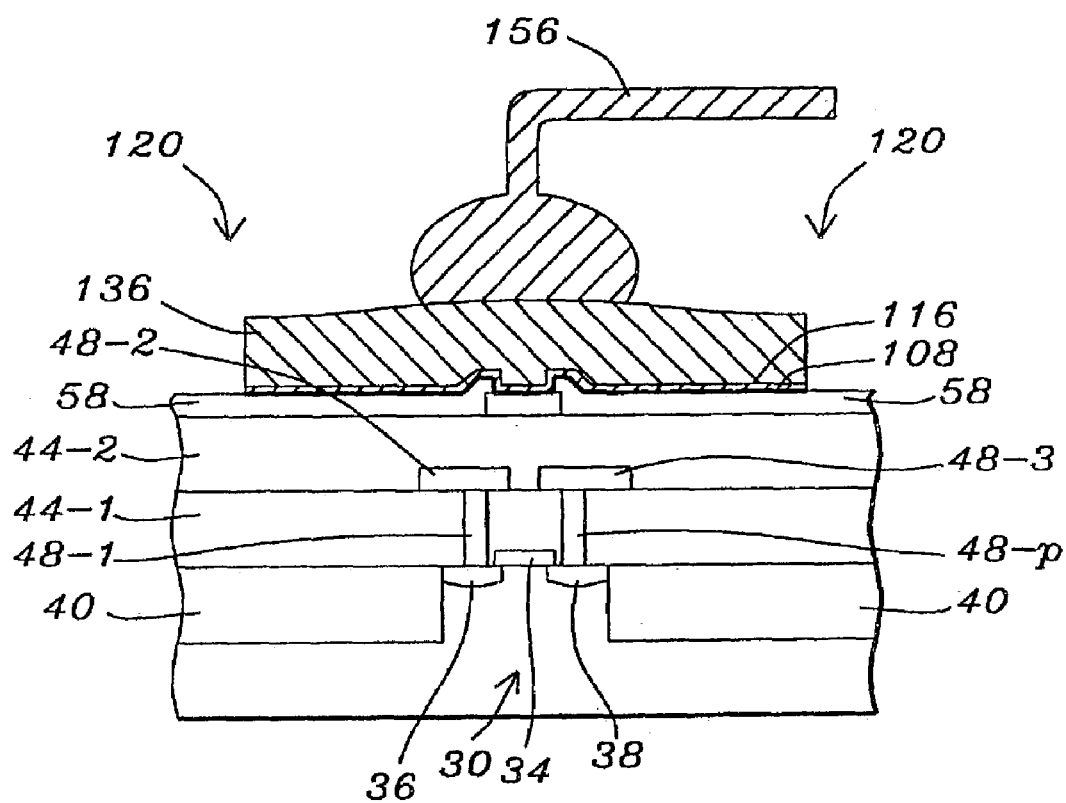

Referring now to FIGS. 2 and 5, in step 138, the photoresist 130 is stripped. In step 142, the first layer 116 that is located outside of the bond pad region 120 is etched. In step 144, the adhesion layer 108 that is located outside of the bond pad region 120 is also etched. Steps 142 and 144 may be completed in a single step if desired. In step 150, additional processing is performed such as die sawing or other suitable processing. In step 154, a wire 156 is bonded to the second layer 136. In a preferred embodiment, the wire 156 includes Au.

Figure 6:
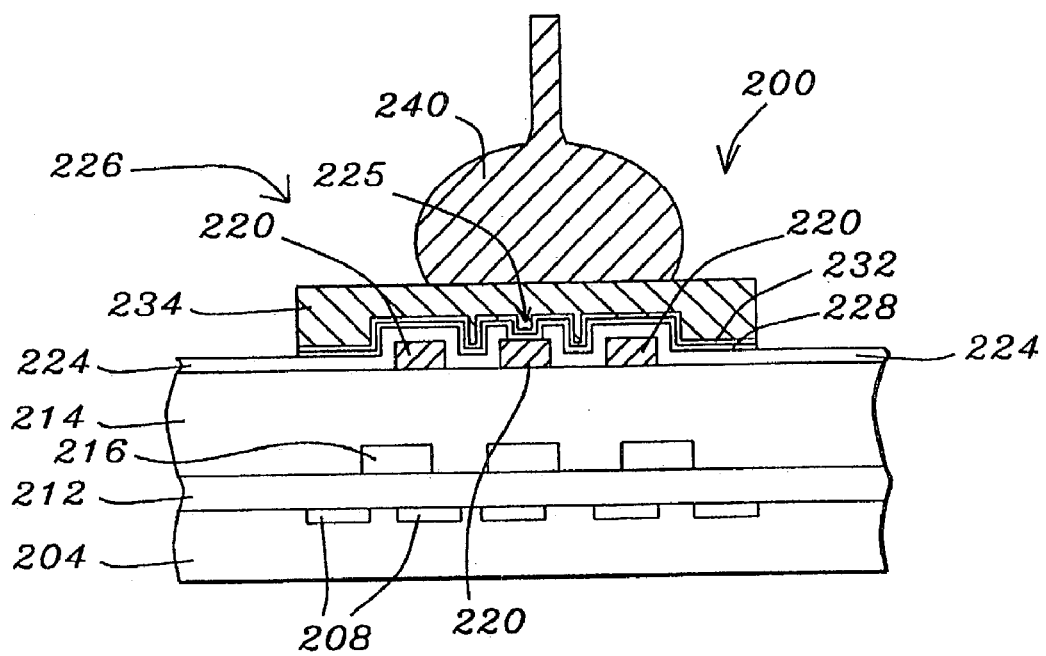
FIG. 6 is a cross-sectional view of another embodiment of the bond pad according to the present invention.

Referring now to FIG. 6, an alternate exemplary embodiment of an IC die 200 is shown to include a substrate 204. Active and/or passive devices that are generally identified at 208 are formed on the substrate 204. The IC die 200 includes one or more dielectric layers 212 and 214 and metal interconnect layers 216 and/or vias. The interconnect layers 216 and vias connect the devices 208 to other devices 208 and/or to one or more contact pads 220. A passivation layer 224 is formed over an outermost metal interconnect layer 216, which includes the contact pads 220. The passivation layer 224 may include one or more passivation openings 225, which expose the contact pads 220. A wire bonding structure 226 includes an adhesion layer 228, a first layer 232, and a second layer 234 as described above. A wire 240 is bonded to the bulk layer 234 as described above. As can be appreciated, the dielectric layers 212 and 214 may be susceptible to damage when conventional bond pad structures are used, particularly when the dielectric layers 212 and 214 include low-k dielectric materials. Likewise, the active and/or passive devices also may be susceptible to damage when conventional bond pad structures are used. The bond pad structure according to the present invention eliminates damage to these structures.

Figure 7:
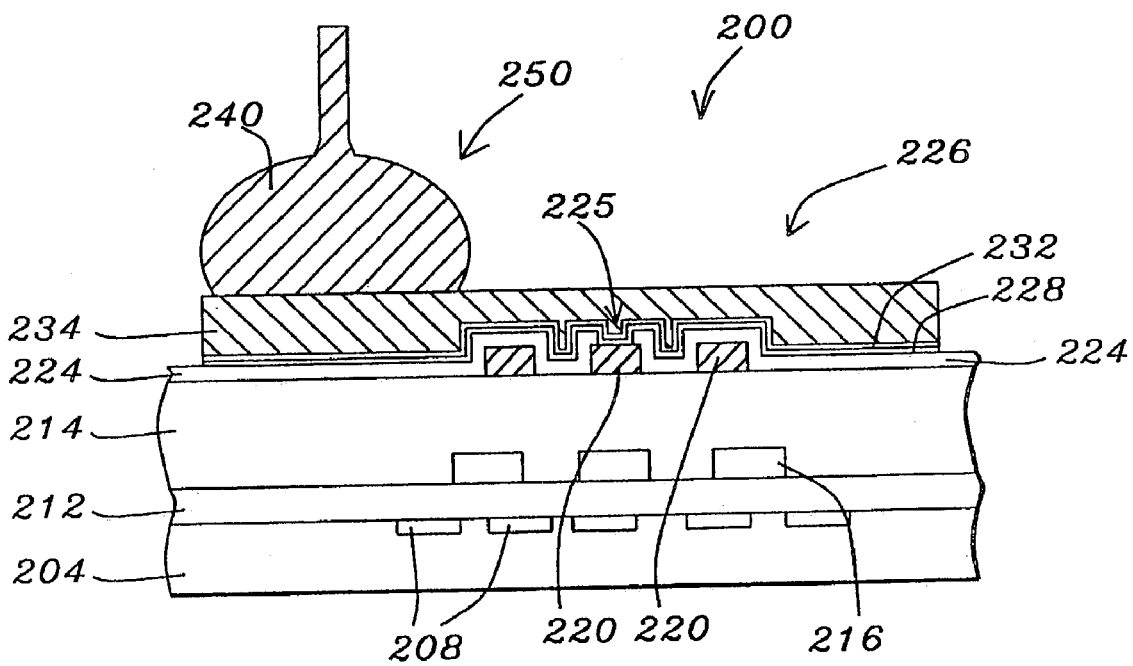
FIG. 7 illustrates a bond pad with a wire bonding region that is laterally displaced from a passivation opening.

Referring now to FIG. 7, the width of the second layer 234, the first layer 232, and the adhesion layer 228 in FIG. 6 have been increased relative to the contact pads 220. A wire bonding region 250 is laterally displaced with respect to the passivation opening 225 in the passivation layer 224 to provide additional layout flexibility. In FIG. 7, the second layer 234 is located over at least one of the active and/or passive devices 208. The wire bonding region 250 is laterally spaced from the passivation opening 225.

Figure 8:
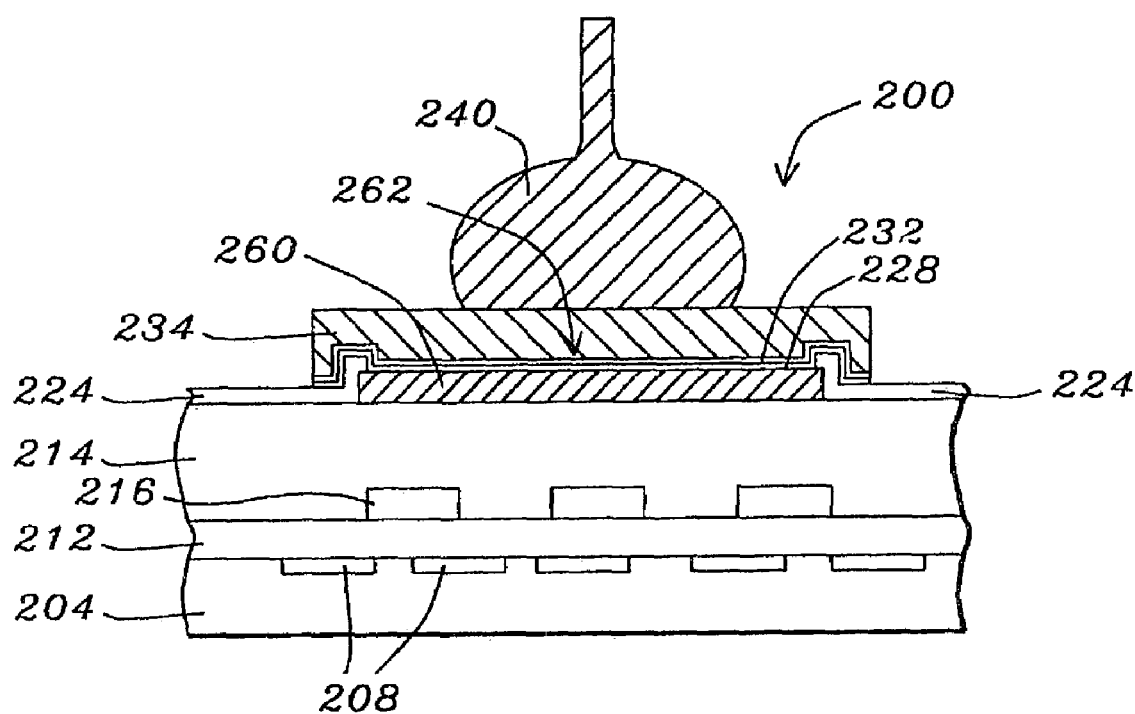
FIG. 8 illustrates a bond pad and an enlarged contact pad formed in a top metal interconnect layer;.

Referring now to FIG. 8, the outermost interconnect layer includes a wider contact pad 260 instead of one or more narrower contact pads 220 that are shown in FIGS. 6 and 7. A wider opening 262 is formed in the passivation layer 224 to provide an increased contact area. The increased contact area reduces the resistance of the bond pad/contact pad connection. In a preferred embodiment, the wider passivation opening 262 has a width of 40 μm to 100 μm.

There are numerous variations of the present invention that will be apparent to skilled artisans. For example, the number of dielectric layers 212 and 214 and interconnect layers 216 can be varied. In addition, while only one opening is shown in the passivation layer 224, additional openings can be provided as needed. The invention is also not limited as to the location of the openings in the passivation layer 224 relative to the wire bond region.

The wire bonding regions can be aligned with or offset from the contact pads. These structures can likewise be formed over the active and/or passive devices without causing damage.

An experiment was performed in which the structure of FIG. 6 was fabricated using a 4 μm thick electroplated Au as the second layer 234 and Fluorinated Silicate Glass (FSG) as the dielectric layers 212 and 214. After fabricating the bond pads 234, the dielectric layers 212 and 214 and the devices 208 were not damaged.

The present invention reduces the IC die size by allowing the bond pads to be located over the dielectric layers, the active devices and/or the passive devices. Due to the use of compliant material in the bulk layers according to the present invention, there are no restrictions on underlying interconnect metal routing. The present invention absorbs the thermal and/or mechanical stress that occurs during wire bonding and prevents damage to underlying dielectric layers, the active devices and/or the passive devices. The present invention also provides improved stress absorption capabilities that are particularly useful for submicron technologies that employ low-k dielectrics (which include CVD or spun-on materials).

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A structure for enabling wire bond connections over active regions of an integrated circuit (IC) die, comprising: a substrate, in or on which are formed active devices, the die further comprising at least one interconnect metal layer having at least one top level metal contact, and a passivation layer over the at least one interconnect metal layer, wherein the passivation layer comprises at least one opening through which is exposed the at least one top level metal contact point; an adhesion layer formed on the passivation layer; and a gold bond pad formed directly on the adhesion layer over the passivation layer, connected to said top level metal contact through said opening, said gold bond pad being formed directly over at least one active device.

2. The structure of claim 1 wherein the gold bond pad is formed over said opening in said passivation layer.

3. The structure of claim 1 wherein a bonding location for the gold bond pad is over said opening in said passivation layer.

4. The structure of claim 1 wherein said opening has a minimum width of about 0.5 μm.

5. The structure of claim 1 wherein said passivation layer comprises one or more layers of inorganic material.

6. The structure of claim 1 wherein said adhesion layer is Ti, Cr, TiW or TiN.

7. The structure of claim 1 wherein said gold bond pad comprises soft Au having a hardness range of less than about 150 Hv, an Au purity larger than about 97%, and a thickness larger than about 1 μm.

8. The structure of claim 1 wherein the adhesion layer is formed over said passivation layer.

9. The structure of claim 1 wherein said passivation opening has a width between 40 μm and 100 μm.

10. A wire connection structure for an integrated circuit (IC) die, comprising:
semiconductor means for providing at least one of an active device and a passive device and that includes:
dielectric means that is arranged adjacent to said at least one of said active and passive device for providing insulation,
metal interconnect means that is arranged adjacent to said at least one of said active and passive device for providing interconnections, wherein said metal interconnect means defines a contact pad, and
passivation means for insulating said outermost metal interconnect means and including at least one passivation opening that exposes said contact pad; and
gold bond pad means arranged directly over said passivation means and said active device for absorbing bond pad fabrication stress and for providing a connection to said contact pad through said passivation opening, the gold bond pad means being formed directly on an adhesion layer that is formed on said passivation means and said exposed contact pad.

11. The wire connection structure of claim 10 further comprising wire means for providing a connection to said gold bond pad means and that is bonded to said gold bond pad means in a wire bonding region.

12. The wire connection structure of claim 10 wherein said wire bonding region is formed over said passivation opening.

13. The wire connection structure of claim 10 wherein said passivation means includes one or more layers of inorganic material.

14. The wire connection structure of claim 10 wherein said gold bond pad means includes:
 a first layer formed over said adhesion layer;
 a second layer formed over said first layer.

15. The wire connection structure of claim 14 wherein said adhesion layer includes at least one of titanium (Ti), chromium (Cr), titanium tungsten (TiW) and titanium nitride (TiN).

16. The wire connection structure of claim 14 wherein said first layer includes gold that is deposited by sputtering.

17. The wire connection structure of claim 14 wherein said second layer includes gold that is deposited by electroplating.

18. The wire connection structure of claim 14 wherein said second layer has a hardness range of less than about 150 Hv, and wherein said gold of said second layer has a purity that is greater than or equal to about 97% and a thickness that is greater than or equal to 1 μm.

19. A wire connection structure for an integrated circuit (IC) die, comprising:
 semiconductor means for providing at least one of an active device and a passive device and that includes:
  dielectric means that is arranged adjacent to said at least one of said active and passive device for providing insulation,
  metal interconnect means that is arranged adjacent to said at least one of said active and passive device for providing interconnections, wherein said metal interconnect means defines a contact pad, and
  passivation means for insulating said outermost metal interconnect means and including at least one passivation opening that exposes said contact pad;
 gold bond pad means arranged directly over said passivation means and said at least one of said active and passive devices for absorbing wire bonding stress and for providing a connection to said contact means through said passivation opening; and
 an adhesion layer formed on said passivation means that includes at least one of Ti, Cr, TiW and TiN, the gold bond pad means being formed directly on the adhesion layer;
 a seed layer formed over said adhesion layer that includes gold; and
 a bulk layer formed over said seed layer that includes gold.

20. The wire connection structure of claim 19 further comprising a wire that is bonded to said gold bond pad means in a wire bonding region.

21. The wire connection structure of claim 20 wherein said wire bonding region is over said passivation opening.

22. The wire connection structure of claim 19 wherein said bulk layer has a hardness range that is less than or equal to 150 Hv.

23. The wire connection structure of claim 19 wherein said gold has a purity that is greater than or equal to about 97%.

24. The wire connection structure of claim 19 wherein said bulk layer has a thickness that is greater than or equal to about 1 μm.

25. The wire connection structure of claim 19 wherein said seed layer is deposited by sputtering.

26. The wire connection structure of claim 19 wherein said bulk layer is deposited by electroplating.

27. A wire connection structure for an integrated circuit (IC) die, comprising:
 semiconductor means for providing an active device and that includes:
  dielectric means that is arranged adjacent to said active device for providing insulation,
  metal interconnect means that is arranged adjacent to said active device for providing interconnections, wherein said metal interconnect means defines a contact pad, and
  passivation means for insulating said outermost metal interconnect means and including at least one passivation opening that exposes said contact pad;
 an adhesion layer formed on said passivation means and said exposed contact pad; and
 gold bond pad means arranged directly over said passivation means and said active device for absorbing bond pad fabrication stress and for providing a connection to said contact pad through said passivation opening, the gold bond pad means being formed directly on the adhesion layer.

28. A wire connection structure for an integrated circuit (IC) die, comprising:
 semiconductor means for providing an active device and that includes:
 dielectric means that is arranged adjacent to said active device for providing insulation,
  metal interconnect means that is arranged adjacent to said active device for providing interconnections, wherein said metal interconnect means defines a contact pad,
  passivation means for insulating said outermost metal interconnect means and including at least one passivation opening that exposes said contact pad;
 gold bond pad means arranged directly over said passivation means and said active device for absorbing bond pad fabrication stress and for providing a connection to said contact means through said passivation opening; and
  an adhesion layer formed on said passivation means that includes at least one of Ti, Cr, TiW and TiN, the gold bond pad being formed directly on the adhesion layer, wherein the gold bond pad means includes:
   a seed layer formed over said adhesion layer that includes gold; and
   a bulk layer formed over said seed layer that includes gold.

* * * * *